United States Patent [19]

Morris et al.

[11] Patent Number: 4,641,216

[45] Date of Patent: Feb. 3, 1987

[54] SIGNAL PROCESSOR MODULE FOR GROUND FAULT CIRCUIT BREAKER

[75] Inventors: Robert A. Morris, Burlington; Paul T. Rajotte, Plainville, both of Conn.

[73] Assignee: General Electric Company, New York, N.Y.

[21] Appl. No.: 725,610

[22] Filed: Apr. 22, 1985

[51] Int. Cl.[4] .............................................. H05K 1/11

[52] U.S. Cl. ........................................ 361/45; 335/18; 336/174; 336/195; 361/395; 361/400

[58] Field of Search ................... 361/42, 45, 356, 392, 361/395, 400; 335/18; 336/65, 82, 174, 175, 195

[56] References Cited

U.S. PATENT DOCUMENTS

| | | | |
|---|---|---|---|
| 3,007,125 | 10/1961 | Forbee | 336/65 |
| 4,498,067 | 2/1984 | Kumokawa et al. | 336/65 |
| 4,507,709 | 3/1985 | Morris et al. | 361/395 |
| 4,521,824 | 6/1985 | Morris et al. | 335/18 |

*Primary Examiner*—A. D. Pellinen
*Assistant Examiner*—Jeffrey A. Gaffin
*Attorney, Agent, or Firm*—Richard A. Menelly; Walter C. Bernkopf; Fred Jacob

[57] ABSTRACT

The neutral excitation and differential current transformers of a ground fault circuit breaker are arranged for automated assembly onto the signal processor circuit board to complete the signal processor module prior to insertion within the ground fault circuit breaker housing. Electrical interconnection between the transformers is made by a unitary conducting strap having means therein for receiving the circuit neutral conductor. The completely assembled signal processor module is connected with the circuit breaker components by means of a single wire.

7 Claims, 3 Drawing Figures

SIGNAL PROCESSOR MODULE FOR GROUND FAULT CIRCUIT BREAKERcl BACKGROUND OF THE INVENTION

A ground fault circuit breaker wherein ground fault interrupting capability is combined with the overload and short circuit interrupting capability of conventional automatic electric circuit breakers is described within U.S. Pat. No. 4,037,185 in the name of Keith W. Klein. Both the ground fault circuit interruption circuit and overcurrent interruption circuit are electrically interconnected and arranged within a partitioned molded case. The electrical interconnection between the ground fault and overcurrent circuits is difficult to achieve on automated assembly equipment for this ground fault circuit breaker design.

Ground fault circuit interrupters (GFCI) having a magnetic sensor module plug-in subassembly which is capable of being assembled in a completely automated process is described in U.S. patent application Ser. No. 579,336 filed Feb. 14, 1984 in the names of R. A. Morris et al. entitled "Electrical Interconnect Arrangement For GFCI Magnetic Sensor Module Plug-In Subassembly" and should be referred to for a detailed description of the electrical and mechanical interconnection of the components making up the signal processor circuit board for the GFCI device. The circuits for such devices are described in U.S. Pat. Nos. 4,345,289 and 4,348,708, both of which are in the name of Edward K. Howell. The circuits described therein basically include a current sensor, a signal processor and an electronic switch. An imbalance is determined in the line and neutral conductors of the distribution circuit by means of a differential current transformer and is amplified by the signal processor pursuant to triggering the electronic switch and completing the energization circuit for a trip solenoid. The current sensor also includes a neutral excitation transformer for responding to a ground fault on the neutral conductor. Both of these patents are incorporated herein for purposes of reference.

It has since been determined that an automated ground fault circuit breaker can be provided by the modular combination of the signal processor printed circuit board with the ground fault module, which includes ground fault interruption facility, and the circuit breaker module, which includes short circuit protection as well as short time and long time overcurrent protection. The signal processor module, the ground fault module and the circuit breaker module are first individually assembled by means of independent automated assembly processes, before being automatically assembled together to form the ground fault circuit breaker unit. This automated modular concept results in a substantial savings of assembly time while synergistically improving the overall response and reliability of the assembled product.

SUMMARY OF THE INVENTION

A signal processor module for ground fault circuit breakers wherein the differential current transformer and neutral excitation transformer are down-loaded onto the signal processor circuit board by means of a completely automated assembly process. Electrical interconnection between the transformer windings and the circuit board are made by means of pins which extend from the transformer support base and holes which extend through the circuit board. Electrical interconnection between the two transformers is made by means of an automatically inserted connecting strap provided with tubular extensions which become inserted through the toroidal-shaped transformer cores through one side of the circuit board and by means of a pair of terminal straps each of which having a complimentary tubular extension for passing through the transformer apertures from an opposite side of the circuit board.

DESCRIPTION OF THE PREFERRED EMBODIMENT

Figure 1:
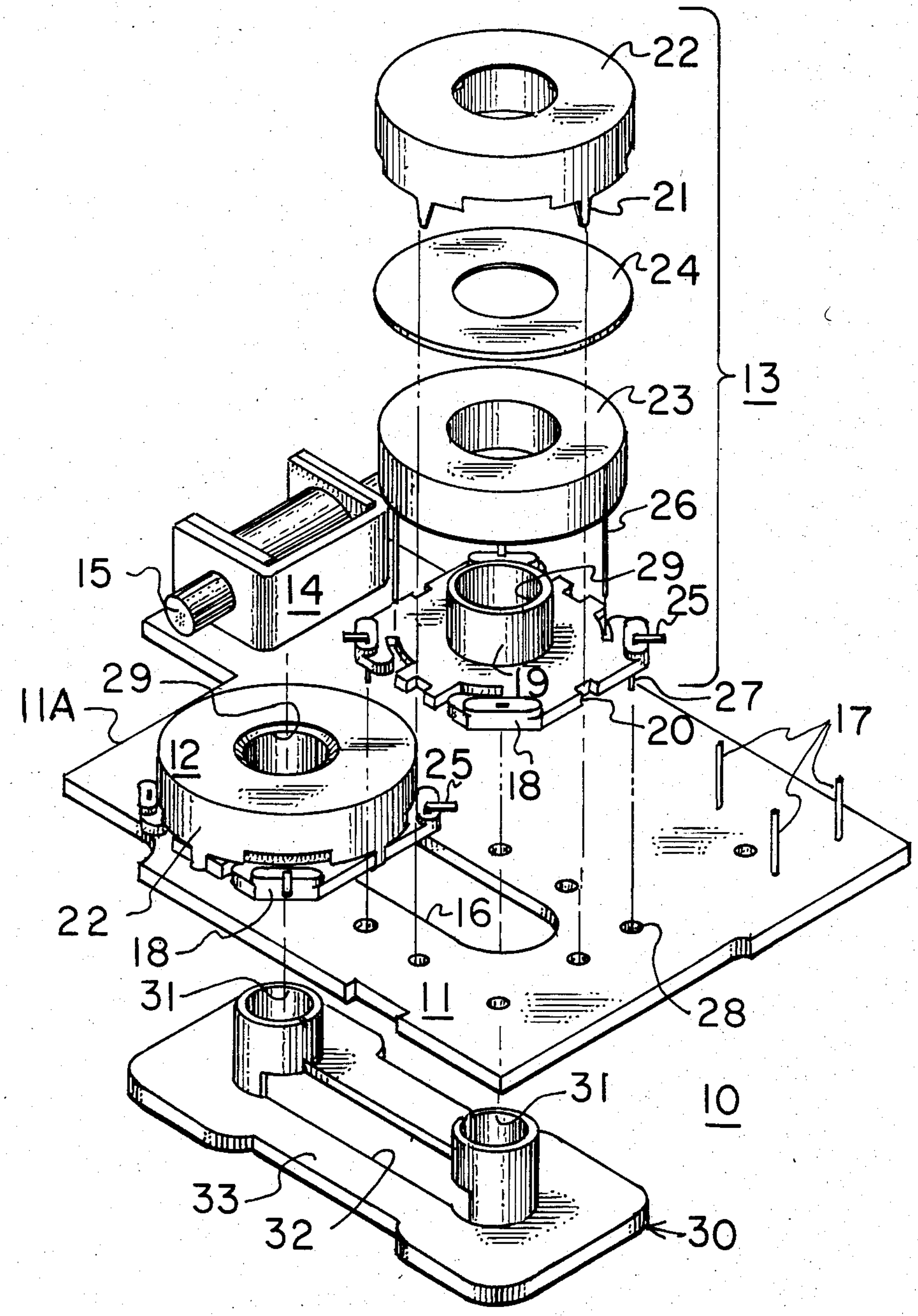
FIG. 1 is a top perspective view of the signal processor module according to the invention with the neutral excitation transformer assembly and connecting strap in isometric projection.
Figure 2:
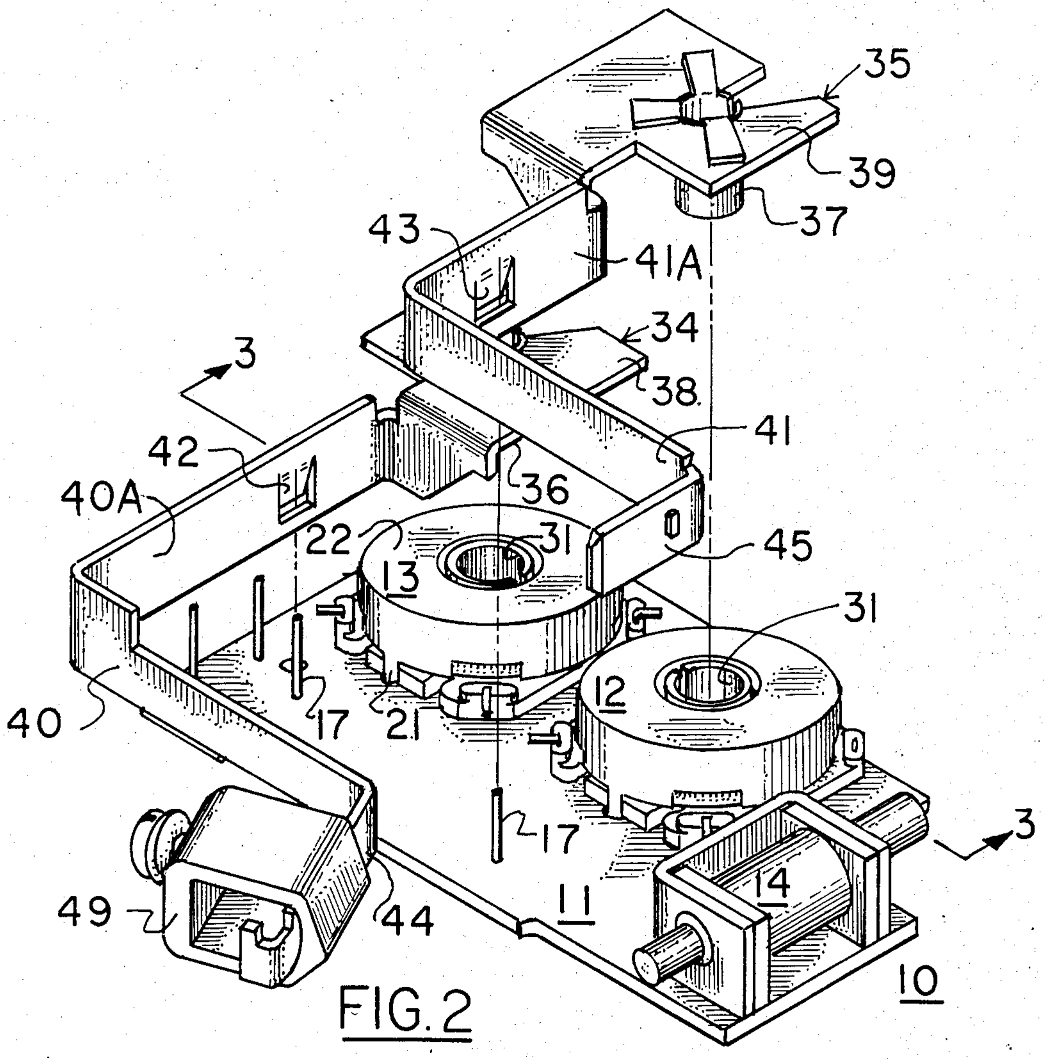
FIG. 2 is a top perspective of the assembled signal processor module of FIG. 1 with the terminal connecting straps in isometric projection.

The signal processor module 10 is shown in FIG. 1 before connection of the differential current transformer 13 and with the neutral excitation transformer 12 already assembled on the printed circuit board 11. The printed circuit board contains the electrical circuits described within the aforementioned Howell patents and reference should be made thereto for a good description of the electrical interaction between the differential current transformer, neutral excitation transformer and the solenoid 14 in response to ground fault conditions. The differential current transformer 13 is similar to that described within U.S. patent application Ser. No. 579,337 filed Feb. 13, 1984 and entitled "Magnetic Sensor Module For A Ground Fault Circuit Interrupter" in the names of R. A. Morris et al., which application is incorporated herein for purposes of reference. For completely automated assembly of the signal processor module the neutral excitation and differential current transformers 12, 13 can be pre-assembled in a separate process and then robotically attached to the printed circuit board 11. Alternatively, both transformers can be assembled in a continuous assembly process wherein the printed circuit board 11 is carried by a conveyor and the individual transformer components are down-loaded, that is serially assembled from a vertical location above the circuit board, as shown in FIG. 1. The solenoid 14 is first attached to the printed circuit board 11 with the solenoid plunger 15 oriented toward the cutaway portion 11A of the printed circuit board. Both transformers are arranged over an access slot 16 formed within the printed circuit board for allowing interconnection therebetween by means of the connecting strap 30. The insulating support pedestal 18 having an upstanding insulating cylinder 19 is placed on the printed circuit board and the transformer winding 23 is arranged around the insulating cylinder. Electrical connection between the winding and the printed circuit board is made by means of the transformer leads 26 and the terminals 25 which provide electrical connection with the printed circuit board by means of pins 27 extending from the bottom of terminals 25 and holes 28 extending through the printed circuit board. An insulating washer 24 is arranged between the winding 23 and the transformer metallic closure 22 which clampingly enagages the insulating pedestal 18 by means of slots 20 formed on the bottom of the pedestal 18 and tabs 21 extending from and integrally formed on the closure 22. Once the neutral excitation and differential transformers 12, 13 are electrically connected with the printed circuit board components, the connecting strap 30 is attached by inserting the integrally formed split conducting cylinders 31 through access slot 16 into the openings 29 through both of the transformer insulating cylinders 19. The narrow portions 33 extending along both sides of the slot 32 electrically connect the conducting cylinders 31 and the slot 32 provides clearance for an insulated wire 46 which is shown passing through both of the conducting cylinders 31 in FIG. 3. The connecting pins 17 are electrically connected with the electronic components on the bottom surface of the printed circuit and extend upward through the printed circuit board for electrical connection with the neutral strap load connector 34 and neutral strap line connector 35 as shown in FIG. 2. Once the neutral excitation and differential transformers 12, 13 are electrically arranged on the printed circuit board 11, and the conducting cylinders 31 are inserted, the neutral strap load and line connectors 34, 35 are connected to the transformers by inserting the conducting cylinders 36, 37 downwardly extending from the bottom of the load and line connectors within the conducting cylinders 31 upwardly extending from the connecting strap 30 as shown earlier in FIG. 1. In a similar manner as described within the aformentioned patent applications to R. A. Morris et al., one of the tabs 21 extending from the closure 22 electrically connects with the circuit ground in order to provide electro-magnetic shielding to the transformer windings 23. The flat surface 39 formed on the bottom of the neutral strap line connector 35 abuts against the top of the metallic closure 22 and integrally connects with the formed angular end 45 by means of the integral L-shaped conductor 41. The foot portion 41A of the L-shaped conductor is provided with a lanced aperture 43 which captures one of the connecting pins 17 and electrically connects the neutral strap line connector 35 with the printed circuit board. In a similar manner, the flat surface 38 formed on the bottom of the neutral strap load connector 34, abuts against the top of the metallic closure 22. An angled end 44 connects with the integrally formed flat surface 38 by means of the integrally formed L-shaped conductor 40 which includes a lanced aperture 42 formed in the foot portion 40A for capturing another one of the connecting pins 17 and electrically connects the neutral strap load connector 34 with the printed circuit board. Electrical connection with the external circuit conductors (not shown) and the signal processor module 10 is made by means of terminal lug connectors 49 one of which is shown attached, for example, to the neutral strap load connector angular end 44.

Figure 3:
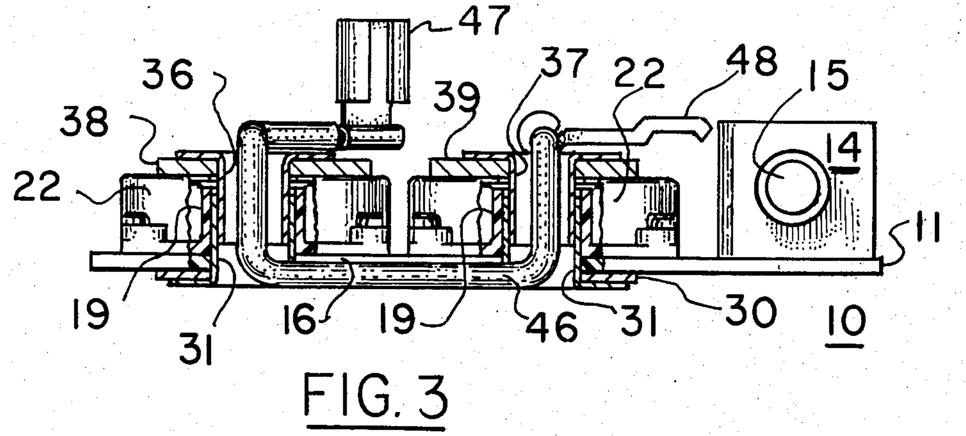
FIG. 3 is a side view in partial cut-away section of the completely assembled signal processor module.

The electrical connection between the neutral excitation and differential current transformers 12, 13 is best seen by referring now to FIG. 3 wherein the insulated wire 46 is arranged within the slot 16 formed within the printed circuit board 11 and extending upward through both conducting cylinders 31 and terminating at each end by means of terminal connectors 47, 48 for ease in electrical connection with the external neutral circuit conductor. One path of electrical conduction through the neutral excitation transformer 12 and differential current transformer 13 is provided by means of conducting cylinders 37, 31, connecting strap 30 and conducting cyclinders 36, 31. The other path of electrical conduction through the transformers is provided by means of the insulated wire 46. It is noted that the insulating cylinders 19 electrically insulate the windings from the conducting cylinders and that the insulation provided on the insulated wire 46 provides sufficient insulation to any current passing through the conductor. The completely assembled signal processor module 10 is now ready for assembly within a ground fault circuit breaker in such a manner that the solenoid plunger 15 extending from the solenoid 14 will operationally interact with the circuit breaker tripping mechanism in a manner similar to that described in the aformentioned patent to Klein et al.

Having described our invention, what we claim as new and desire to secure by Letters Patent is:

1. A ground fault circuit breaker signal processor module comprising:

printed circuit board means containing electric signal processor circuit components on one surface and electrically conductive pins extending through said printed circuit board to an opposite surface for providing electrical connection between said signal processor components and an external circuit;

an apertured neutral excitation current transformer and an apertured differential current transformer spaced apart and arranged side by side on said opposite surface for sensing current through said external circuit;

solenoid means on said opposite surface for responding to electric signals generated within said signal processor circuit upon the occurrence of ground fault current through said external circuit; and means on said printed circuit board defining an opening for providing electrical acess to said neutral excitation and said differential current transformers;

said neutral excitation and differential current transformers being arranged over said opening and a connecting strap being arranged under said opening whereby a first pair of electrically conductive extensions on said connecting strap extend through said opening and at least partially through said neutral excitation and differential current transformer apertures.

2. The ground fault circuit breaker signal processor module of claim 1 including a pair of terminal connector straps arranged over said neutral excitation and differential current transformers each having a second electrical extension extending at least partially through said neutral excitation and differential current transformer apertures into electrical contact with said first pair of electrical extensions for providing electrical transport through said neutral excitation and differential current transformer apertures.

3. The ground fault circuit breaker signal processor module of claim 2 wherein said connecting strap includes means defining an opening for receiving an electrical conductor electrically insulated from said connecting strap for providing further electrical transport through said neutral excitation and differential current transformer apertures.

4. The ground fault circuit breaker signal processor module of claim 2 wherein each of said terminal connector straps include an angled end opposite said electrical extension for providing electrical connection with said external circuit.

5. The ground fault circuit breaker signal processor module of claim 4 wherein each of said terminal connector straps further include a lanced aperture intermediate said electrical extension and said angled end for receiving said printed circuit board conductive pins and thereby providing electrical connection between each of said connector straps and said printed circuit board.

6. The ground fault circuit breaker signal processor module of claim 1 wherein each of said connecting strap electrical extensions comprise a first cylinder having a first diameter and each of said terminal connector strap extensions comprise a second cylinder having a second diameter, said first and second diameters being sized for a press-fit interconnection.

7. The ground fault circuit breaker signal processor module of claim 1 wherein said transformer means further include a metallic closure member arranged over a transformer winding and including a plurality of tabs integrally formed at one end of said closure, at least one of said tabs extending through said printed circuit board for electrical connection with said signal processor circuit.

* * * * *